United States Patent [19]

Koo et al.

[11] Patent Number: 5,677,234

[45] Date of Patent: Oct. 14, 1997

[54] METHODS OF FORMING ISOLATED SEMICONDUCTOR DEVICE ACTIVE REGIONS

[75] Inventors: Bon-young Koo, Kyungki-do; Byung-hong Chung, Seoul; Hee-seok Kim, Kyungki-do; Yun-gi Kim, Kangwon-do, all of Rep. of Korea

[73] Assignee: Samsung Electronics Co., Ltd., Suwon, Rep. of Korea

[21] Appl. No.: 665,294

[22] Filed: Jun. 18, 1996

[30] Foreign Application Priority Data

Jun. 22, 1995 [KR] Rep. of Korea ............ 95-16896

[51] Int. Cl.⁶ ........................................ H01L 21/76
[52] U.S. Cl. ........................... 437/69; 437/70; 437/968
[58] Field of Search ........................ 437/69, 70, 72, 437/73, 241, 968

[56] References Cited

U.S. PATENT DOCUMENTS

| | | | |
|---|---|---|---|
| 5,358,893 | 10/1994 | Yang et al. | 437/69 |
| 5,447,885 | 9/1995 | Cho et al. | 437/69 |
| 5,523,255 | 6/1996 | Hyung et al. | 437/69 |

FOREIGN PATENT DOCUMENTS 0206824  7/1992  Japan.

OTHER PUBLICATIONS

Hui et al., "Sealed-Interface Local Oxidation Technology", IEEE Transaction on Electron Devices, vol. ED-29, No. 4, Apr. 1982, pp. 554–561.

*Primary Examiner*—Trung Dang
*Attorney, Agent, or Firm*—Bell, Seltzer, Park, & Gibson

[57] ABSTRACT

Methods of forming semiconductor device active regions include the steps of forming a buffer layer containing a material susceptible to oxidation, such as polycrystalline or amorphous silicon, on a semiconductor substrate. To inhibit any native oxide film on the buffer layer from facilitating the formation of field oxide isolation regions having bird's beaks, the native oxide film is converted to a nitrogen containing film, such as silicon oxynitride, by nitrating the native oxide film. The silicon oxynitride film can be formed by exposing the oxide film to a nitrogen containing plasma, implanting nitrogen ions into the oxide film or annealing the oxide film in a nitrogen containing atmosphere, for example. During the nitrating step, chemically active oxygen in the native oxide film becomes bound to the nitrogen incorporated therein. A top oxidation resistant layer containing silicon nitride can then be formed on the nitrated surface of the buffer layer and used as an oxidation mask during a subsequent step of oxidizing the buffer layer to form field oxide isolation regions. By binding chemically active oxygen to nitrogen during the nitrating step, lateral oxidation under the top oxidation resistant layer is inhibited by limiting the lateral transport of chemically active oxygen. The masking properties of the top oxidation resistant layer can therefore be enhanced and utilized to form field oxide isolation regions having short or nonexistent bird beak's.

8 Claims, 3 Drawing Sheets

METHODS OF FORMING ISOLATED SEMICONDUCTOR DEVICE ACTIVE REGIONS

FIELD OF THE INVENTION

The present invention relates to semiconductor device fabrication methods, and more particularly to methods of forming active regions of semiconductor devices.

BACKGROUND OF THE INVENTION

A common technique for forming field oxide isolation regions in semiconductor substrates includes local oxidation of silicon (LOCOS). However, such technique typically results in the formation of bird's beaks which laterally encroach upon adjacent active regions and limit their size. Accordingly, LOCOS may not be a suitable method to achieve very high integration densities because the lateral area occupied by the bird's beaks typically do not scale downward with the scaling in device size.

Another technique known as selective poly-silicon oxidation (SEPOX) has been proposed to inhibit bird's beak formation in field oxide isolation regions. However, such conventional techniques have not been completely successful in eliminating formation of bird's beaks. For example, FIGS. 1A–1D illustrate a conventional SEPOX method. In particular, FIG. 1A illustrates a semiconductor substrate 1 having a plurality of layers sequentially formed thereon. These layers include a pad oxide layer 3 (e.g., $SiO_2$), a polycrystalline silicon layer 5 and a silicon nitride layer 7. In FIG. 1B, the silicon nitride layer 7 is patterned using a photoresist layer (not shown) as mask. The exposed portions of the polycrystalline silicon layer 5 are then oxidized to form field oxide isolation regions 9. However, as illustrated best by FIG. 1C, the field oxide isolation regions 9 typically encroach underneath the patterned silicon nitride layer 7. Accordingly, the removal of the patterned silicon nitride layer 7 typically exposes laterally extending bird's beaks, shown as regions "b" in FIGS. 1C–1D. As will be understood by those skilled in the art, these bird's beaks reduce the effective area of the active regions defined thereby. The formation of the bird's beaks also limits the extent to which the remaining portions of the polycrystalline silicon layer 5 can be effectively removed from underneath the bird's beaks.

Accordingly, notwithstanding these above methods, there continues to be a need for methods of forming active regions which are not limited in size because of encroachment by the bird's beaks of the field oxide isolation regions formed at their periphery.

SUMMARY OF THE INVENTION

It is therefore an object of the present invention to provide improved methods of forming active regions in semiconductor substrates.

It is another object of the present invention to provide methods of forming highly integrated active regions of relatively large lateral dimensions.

It is still another object of the present invention to provide methods of forming field oxide isolation regions with reduced susceptibility to bird's beak formation.

These and other objects, features and advantages of the present invention are provided by methods which inhibit the formation of field oxide isolation regions having bird's beaks that define the lateral peripheries of active regions in a semiconductor substrate. These methods preferably include the steps of forming a buffer layer containing a material susceptible to oxidation, such as polycrystalline or amorphous silicon, on a semiconductor substrate. However, to inhibit any native oxide film on the buffer layer from facilitating the formation of field oxide isolation regions having bird's beaks, the native oxide film is first converted to a nitrogen containing layer, such as silicon oxynitride, by nitrating the native oxide film. This can be achieved by exposing the native oxide film to a nitrogen containing plasma, implanting nitrogen ions into the native oxide film or annealing the native oxide film in a nitrogen containing atmosphere, for example.

During the nitrating step, chemically active oxygen in the native oxide film becomes bound to the nitrogen incorporated therein. A top oxidation resistant layer such as silicon nitride can then be formed on the nitrated surface of the buffer layer and used as an oxidation mask during a subsequent step of selectively oxidizing the buffer layer to form field oxide isolation regions. By binding chemically active oxygen to nitrogen during the nitrating step, lateral oxidation under the top oxidation resistant layer is inhibited by limiting the lateral transport of chemically active oxygen (i.e., lateral oxygen flux). Thus, by nitrating the surface of the buffer layer to convert the native oxide film, the masking properties of the top oxidation resistant layer can be enhanced and utilized to form field oxide isolation regions having short or nonexistent bird beak's. Alternatively, the native oxide film can be converted to a nitrogen containing film after the step of forming the top oxidation resistant layer, by exposing the buffer layer and top oxidation layer to a nitrogen containing gas at relatively high temperature.

DESCRIPTION OF PREFERRED EMBODIMENTS

Figure 1A:
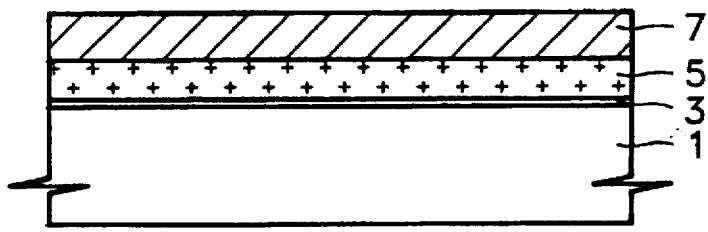
FIGS. 1A–1D illustrate schematic cross-sectional views of intermediate structures illustrating a method of forming an active region of a semiconductor device, according to the prior art.
Figure 1B:
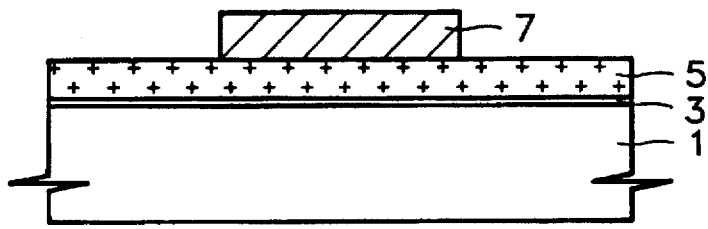
Figure 1C:
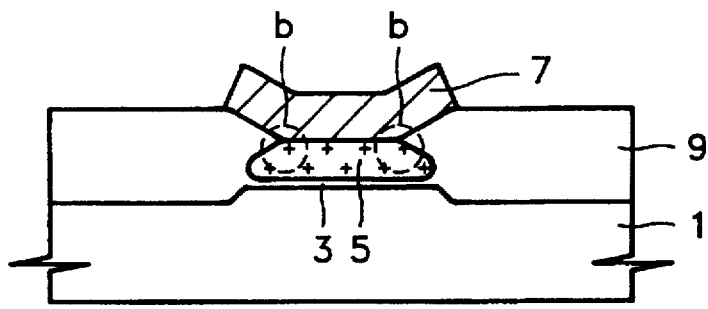
Figure 1D:
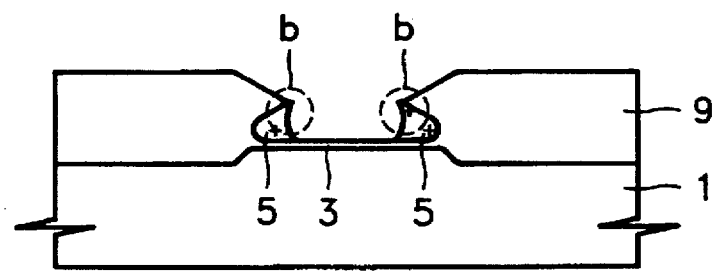

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 2A:
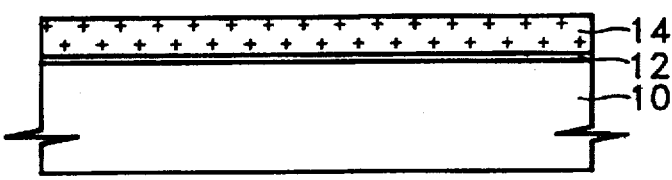
FIGS. 2A–2E illustrate schematic cross-sectional views of intermediate structures illustrating methods of forming an active region of a semiconductor device, according to the present invention.

Referring now to FIGS. 2A–2E and 3, preferred methods of forming active regions of semiconductor devices will be described. In particular, FIG. 2A illustrates steps of forming a pad oxide layer 12 (e.g., $SiO_2$) on a face of a semiconductor substrate 10, using such techniques as thermal oxidation. The pad oxide layer 12 may have a thickness in a range between about 100 Å to 200 Å. Next, a buffer layer 14 containing a material susceptible to oxidation is formed on the substrate 10. Here, the buffer layer 14 may comprise polycrystalline or amorphous silicon and may be formed using low pressure chemical vapor deposition (LPCVD). The buffer layer 14 may be formed to a preferred thickness in a range between about 700 Å to 900 Å, and more preferably about 700 Å. As will be understood by those skilled in the art, the formation of the buffer layer 14 typically includes the formation of a native oxide surface film (e.g., $SiO_2$) whenever an oxidizing atmosphere is present at the outer surface of the buffer layer 14.

Figure 2B:
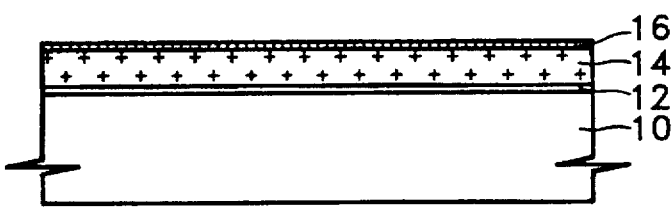
Figure 2C:
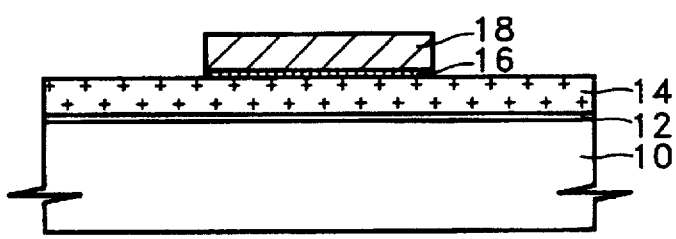

Referring now to FIGS. 2B–2C, a top oxidation resistant layer 18 is formed on the buffer layer 14. The top oxidation resistant layer 18 may be formed by depositing a layer of silicon nitride ($Si_3N_4$) using LPCVD and then patterning the silicon nitride layer using a photoresist layer (not shown) as an etching mask. Preferably, the silicon nitride layer is formed to have a thickness in a range between about 1500 Å to 2000 Å, and more preferably about 1500 Å. However, to inhibit the formation of a bird's beak underneath the top oxidation resistant layer 18 during a subsequent oxidation step, the native oxide film is first converted to a bottom oxidation resistant layer 16 containing nitrogen, by nitrating a surface of the buffer layer 14. During this step, chemically active oxygen in the native oxide film becomes bound to nitrogen to preferably form a layer of silicon oxynitride (SiON), for example. While not wishing to be bound by any theory, it is believed that by binding chemically active oxygen to nitrogen by nitrating the surface of the buffer layer 14, lateral oxidation under the top oxidation resistant layer 18 is inhibited by limiting the lateral transport of chemically active oxygen (i.e., lateral oxygen flux). Thus, by nitrating the surface of the buffer layer 14 to convert the native oxide film, the masking properties of the top oxidation resistant layer 18 can be enhanced. As illustrated best by FIG. 2C, the bottom oxidation resistant layer 16 may be patterned at the same time the top oxidation resistant layer 18 is patterned.

Figure 2D:
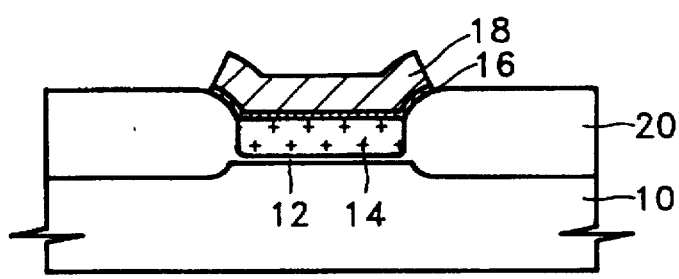
Figure 2E:
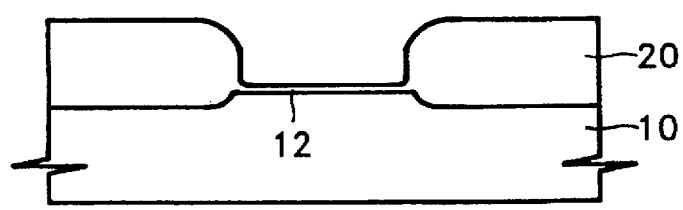

Referring now to FIGS. 2D–2E, the buffer layer 14 and a portion of the substrate 10 underneath the buffer layer 14 are selectively oxidized, using a thermal oxidation technique, to form a relatively thick field oxide region 20 which extends adjacent a periphery of an active region and electrically isolates the active region from adjacent active regions, as will be understood by those skilled in the art. As best illustrated by FIG. 2E, the masked portion of the buffer layer 14, and the top and bottom oxidation resistant layers 18 and 16, respectively, are then removed to expose the thin pad oxide layer 12 which extends opposite the active region of the semiconductor device. As will be understood by those skilled in the art, the pad oxide layer 12 may be removed during subsequent processing steps to expose the active region or portions thereof.

Preferred steps of forming the bottom oxidation resistant layer 16 of FIG. 2C will now be described. In particular, according to a first embodiment of the present invention, the bottom oxidation resistant layer 16 is formed by exposing the oxide film to a nitrogen containing plasma to convert the oxide film to SiON. This step can be performed by injecting ammonia gas into a plasma reactor using a high frequency RF power source of 100–400 W. During this step, the substrate 10 is preferably maintained at a temperature in a range between 25° C.–400° C. and is exposed to the nitrogen containing plasma for a duration in a range between about 10–100 seconds, and more preferably about 60 seconds. According to a second embodiment of the present invention, nitrogen ions can be implanted into the oxide film at the surface of the buffer layer 14. According to this embodiment, the nitrogen ions are preferably at an energy level less than about 100 KeV, but at a dose level greater than about $1\times10^{15}$ ions $cm^{-2}$ to insure that a substantial percentage of the chemically active oxygen in the oxide film is bound to nitrogen.

Figure 3:
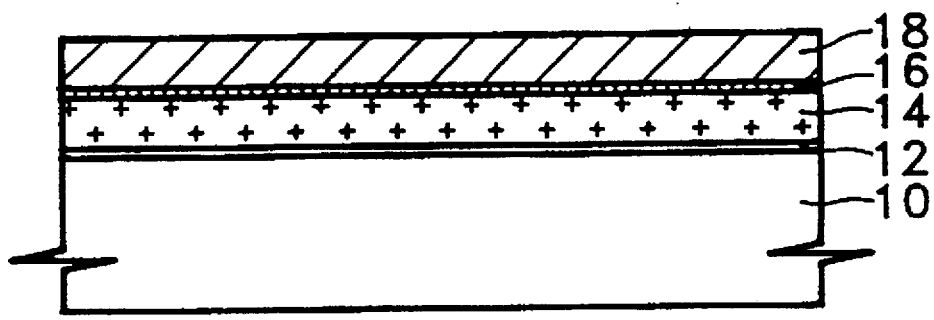
FIG. 3 illustrates a schematic cross-sectional view of an intermediate structure illustrating an alternative step of forming a bottom oxidation resistant layer, according to the present invention.

According to a third embodiment of the present invention, nitrogen can be incorporated into the oxide film by annealing the buffer layer 14 in a nitrogen containing atmosphere such as ammonia gas. During this step, the ammonia gas is preferably maintained at a temperature between about 700° C. and 900° C. for a duration greater than about 30 minutes. This annealing step may be performed using the same equipment used the step of forming the top oxidation resistant layer 18 by LPCVD. Referring now to FIG. 3, a fourth embodiment of the present invention will be described. In particular, FIG. 3 can be substituted for FIG. 2B to illustrate the fourth embodiment. Here, the bottom oxidation resistant layer 16 is formed after the top oxidation resistant layer 18 has been formed on the buffer layer 14, by exposing the composite of layers to a nitrogen containing gas at a temperature greater than about 1000° C. to convert the oxide film (not shown) to SiON.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an active region of a semiconductor device, comprising the steps of:

forming a buffer layer containing a material susceptible to oxidation, on a semiconductor substrate; then forming a first oxidation resistant layer containing nitrogen in the buffer layer by exposing the buffer layer to a nitrogen containing plasma while maintaining a temperature of the substrate at less than about 400° C.; then forming a second oxidation resistant layer on the first oxidation resistant layer; and then selectively oxidizing a portion of the buffer layer using the first and second oxidation resistant layers as a mask, to define the active region in a first portion of the substrate which extends opposite the first and second oxidation resistant layers.

2. The method of claim 1, wherein said oxidizing step comprises oxidizing a portion of the substrate extending opposite the oxidized portion of the buffer layer.

3. The method of claim 2, wherein said buffer layer contains an oxide film extending to a surface thereof; and wherein said step of forming a first oxidation resistant layer comprises converting the oxide film to SiON.

4. The method of claim 3, wherein said step of exposing the buffer layer to a nitrogen containing plasma comprises exposing the oxide film to a nitrogen containing plasma for a duration in a range between about 10 and 100 seconds.

5. The method of claim 4, wherein said step exposing the oxide film to a nitrogen containing plasma comprises supplying the nitrogen containing plasma with between about 100 and 400 Watts of radio frequency power.

6. A method of forming an active region of a semiconductor device, comprising the steps of:

forming a pad oxide layer on a face of a semiconductor substrate;

forming a buffer layer containing a material selected from the group consisting of polycrystalline silicon and amorphous silicon and a native oxide film thereon, on the pad oxide layer, opposite the face;

converting the native oxide film to a silicon oxynitride film by exposing the native oxide film to a nitrogen containing plasma while maintaining a temperature of the substrate at less than about 400° C.; then forming an oxidation resistant layer containing silicon nitride on the silicon oxynitride film; and oxidizing the buffer layer using the oxidation resistant layer as a mask, to define the active region in the substrate.

7. The method of claim 6, wherein said converting step comprises exposing the native oxide film to a nitrogen containing plasma for a duration in a range between about 10 and 100 seconds.

8. The method of claim 6, wherein said step of converting the native oxide film to a silicon oxynitride film by exposing the native oxide film to a nitrogen containing plasma comprises supplying the nitrogen containing plasma with between about 100 and 400 Watts of radio frequency power.

* * * * *